(12) United States Patent
Kim et al.

(10) Patent No.: US 11,502,271 B2
(45) Date of Patent: Nov. 15, 2022

(54) ELECTRONIC DEVICE INCLUDING A DISPLAY PANEL AND A SENSORY BUTTON SET

(71) Applicant: Samsung Display Co., LTD., Yongin-si (KR)

(72) Inventors: Ga Na Kim, Icheon-si (KR); Jung Hun Noh, Yongin-si (KR); Jae Been Lee, Seoul (KR); Yi Joon Ahn, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 48 days.

(21) Appl. No.: 16/935,118

(22) Filed: Jul. 21, 2020

(65) Prior Publication Data

US 2021/0151706 A1 May 20, 2021

(30) Foreign Application Priority Data

Nov. 15, 2019 (KR) .......................... 10-2019-0146742

(51) Int. Cl.
| | | |
|---|---|---|
| *H01L 51/00* | (2006.01) | |
| *H01L 51/52* | (2006.01) | |
| *H01L 27/14* | (2006.01) | |
| *H01L 27/32* | (2006.01) | |
| *G02F 1/1333* | (2006.01) | |
| *H01L 27/146* | (2006.01) | |

(52) U.S. Cl.
CPC ...... *H01L 51/524* (2013.01); *H01L 27/14678* (2013.01); *H01L 27/3225* (2013.01); *H01L 27/3244* (2013.01); *H01L 51/0097* (2013.01); *G02F 1/133305* (2013.01); *G02F 1/133331* (2021.01); *H01L 27/323* (2013.01); *H01L 2251/5338* (2013.01)

(58) Field of Classification Search
CPC .............. H01L 51/524; H01L 51/0097; H01L 27/3225; H01L 27/323; H01L 27/14678; H01L 2251/5338; G02F 1/133305; G02F 1/133331
See application file for complete search history.

(56) References Cited

U.S. PATENT DOCUMENTS

| | | | |
|---|---|---|---|
| 9,807,919 B2 * | 10/2017 | Kwong | ................ H05K 9/0067 |
| 10,324,493 B2 | 6/2019 | Kwak et al. | |
| 10,539,979 B2 | 1/2020 | Ha et al. | |
| 10,620,828 B2 * | 4/2020 | Kim | ........................ G06F 3/044 |

(Continued)

FOREIGN PATENT DOCUMENTS

| | | |
|---|---|---|
| KR | 10-2016-0097106 | 8/2016 |
| KR | 10-2016-0121031 | 10/2016 |

(Continued)

*Primary Examiner* — Ida M Soward

(74) *Attorney, Agent, or Firm* — H.C. Park & Associates, PLC

(57) ABSTRACT

An electronic device including a window having a front surface and a rear surface, a display panel disposed on the rear surface of the window, the display panel having a front surface and a rear surface, and a sensory button set disposed on the rear surface of the display panel. The sensory button set includes a sensor unit, and a pusher disposed between the sensor unit and the display panel configured to transfer an external force applied to a predetermined area of the window to the sensor unit.

19 Claims, 15 Drawing Sheets

(56) References Cited

U.S. PATENT DOCUMENTS

| | | | |
|---|---|---|---|
| 10,921,943 B2* | 2/2021 | Bechstein | G06F 3/0445 |
| 10,936,106 B2* | 3/2021 | Lee | G06F 3/0412 |
| 2010/0259503 A1* | 10/2010 | Yanase | G06F 3/04166 |
| | | | 345/174 |
| 2014/0152596 A1* | 6/2014 | Park | G06F 1/1671 |
| | | | 345/173 |
| 2014/0203953 A1* | 7/2014 | Moser | G06F 3/04886 |
| | | | 341/27 |
| 2015/0116607 A1* | 4/2015 | Cheng | H05K 5/02 |
| | | | 349/12 |
| 2017/0177160 A1* | 6/2017 | Oh | G06F 1/1626 |
| 2017/0218236 A1* | 8/2017 | Matsukawa | B32B 3/08 |
| 2017/0242506 A1* | 8/2017 | Patel | G06F 3/041 |
| 2017/0300736 A1* | 10/2017 | Song | G06V 40/1312 |
| 2018/0088736 A1* | 3/2018 | Jeong | G06F 3/04144 |
| 2018/0157093 A1* | 6/2018 | Jang | H05K 1/144 |
| 2018/0232092 A1* | 8/2018 | Lee | G06F 21/32 |
| 2018/0284841 A1* | 10/2018 | Lee | H04M 1/04 |
| 2018/0341290 A1* | 11/2018 | Sim | G06F 3/042 |
| 2018/0373408 A1* | 12/2018 | Lee | G06F 1/1643 |
| 2019/0138127 A1* | 5/2019 | Seo | H05K 5/03 |
| 2019/0163321 A1* | 5/2019 | Kondoh | G06F 3/0418 |
| 2019/0272058 A1* | 9/2019 | Noma | G09F 9/00 |
| 2019/0302924 A1 | 10/2019 | Kim et al. | |
| 2020/0285722 A1* | 9/2020 | He | G06F 21/32 |
| 2021/0117024 A1* | 4/2021 | Seo | G02F 1/133308 |

FOREIGN PATENT DOCUMENTS

| | | |
|---|---|---|
| KR | 10-1780259 | 9/2017 |
| KR | 10-2019-0013339 | 2/2019 |

* cited by examiner

ELECTRONIC DEVICE INCLUDING A DISPLAY PANEL AND A SENSORY BUTTON SET

CROSS REFERENCE TO RELATED APPLICATION

This application claims priority from and the benefit of Korean Patent Application No. 10-2019-0146742 filed on Nov. 15, 2019, which is hereby incorporated by reference for all purposes as if fully set forth herein.

BACKGROUND

Field

This disclosure relates to an electronic device, and more particularly, to an electronic device including a display panel.

Discussion of the Background

A display panel such as a light emitting display panel or a liquid crystal display panel is applied to an electronic device such as a smart phone, a mobile phone, and a multimedia terminal. Because the display panel, particularly a screen implemented by the display panel, is an external part of the electronic device, the display panel is a key element in the design of the electronic device.

A display panel that is commonly used is formed of a flat plate, and the screen is formed with a flat surface. Recently, as a flexible display panel has been developed, the screen is not limited to a flat surface, but may be formed into a curved surface. In particular, when an edge portion of the display panel is formed as a curved surface, the screen may be extended to a side surface of the electronic device. In this arrangement, it may be difficult to provide a physical button that is typically disposed on a side surface of the electronic device.

The above information disclosed in this Background section is only for understanding of the background of the inventive concepts, and, therefore, it may contain information that does not constitute prior art.

SUMMARY

Embodiments provide a sensory button structure that may replace a physical button in an electronic device having a screen that extends to a side surface thereof.

Additional features of the inventive concepts will be set forth in the description which follows, and in part will be apparent from the description, or may be learned by practice of the inventive concepts.

An electronic device according to an embodiment includes a window, a display panel disposed on a rear surface of the window, and a sensory button set disposed on a rear surface of the display panel. The sensory button set includes a sensor unit, and a pusher positioned between the sensor unit and the display panel to transfer an external force applied to a predetermined area of the window to the sensor unit.

The pusher may include a receiving portion contacting the display panel and a concentrating portion protruding from the receiving portion toward the sensor unit.

The sensory button set may further include a frame and a fixing member disposed in the frame, and the sensor unit may be disposed within the fixing member.

The pusher may include a portion passing through the opening of the fixing member.

The fixing member may include a first fixing member and a second fixing member, and opposite ends of the second fixing member may surround the first fixing member.

The sensory button set may further include a push pad disposed between the pusher and the sensor unit, and a first surface of opposite surfaces of the push pad may contact the pusher, while a second surface may contact the sensor unit.

The push pad may be disposed within the fixing member.

The pusher may contact the sensor unit through the opening of the fixed member.

The electronic device may further include an adhesive member disposed between the display panel and the sensory button set, and a first surface of opposite surfaces of the adhesive member may contact the display panel, while a second surface may contact the fixing member.

The display panel may include a substrate and a protection film disposed at a rear surface of the substrate to have an opening, and at least a portion of the pusher may be positioned within the opening.

The sensor unit may include a pressure sensor and a support plate disposed at at least one side of the pressure sensor.

The support plate may have opposite edge portions in contact with the pressure sensor and a central portion thereof separated from the pressure sensor.

The electronic device may further include a button disposed on a surface of the window to correspond to the sensory button set.

The window and the display panel may include a bending area, and the button may be disposed in the bending area.

An electronic device according to an embodiment includes a window, a display panel disposed on a rear surface of the window, a sensor unit disposed on a rear surface of the display panel, and a pusher disposed between the display panel and the sensor unit.

The pusher may include a first portion and a second portion having a narrower width than the first portion, and the first portion may be in contact with the display panel.

The display panel may include a flat area and a bending area to be bent from the flat area, and the pusher may contact the bending area of the display panel.

The electronic device may further include a push pad disposed between the pusher and the sensor unit, and the push pad may include a first surface that is in contact with the pusher and a second surface that is in contact with the sensor unit.

The electronic device may further include a fixing member configured to accommodate the sensor unit, and the fixing member may have an opening through which a portion of the pusher extends.

The display panel may include a substrate and a protection film attached to be the substrate, and the pusher may contact the protection film or may contact the substrate through an opening of the protection film.

According to the embodiments, it is possible to provide a sensory button structure that may replace a physical button in an electronic device having a screen that extends to a side surface thereof. In addition, the electronic device according to the embodiments may have an effect that can be recognized throughout the specification.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
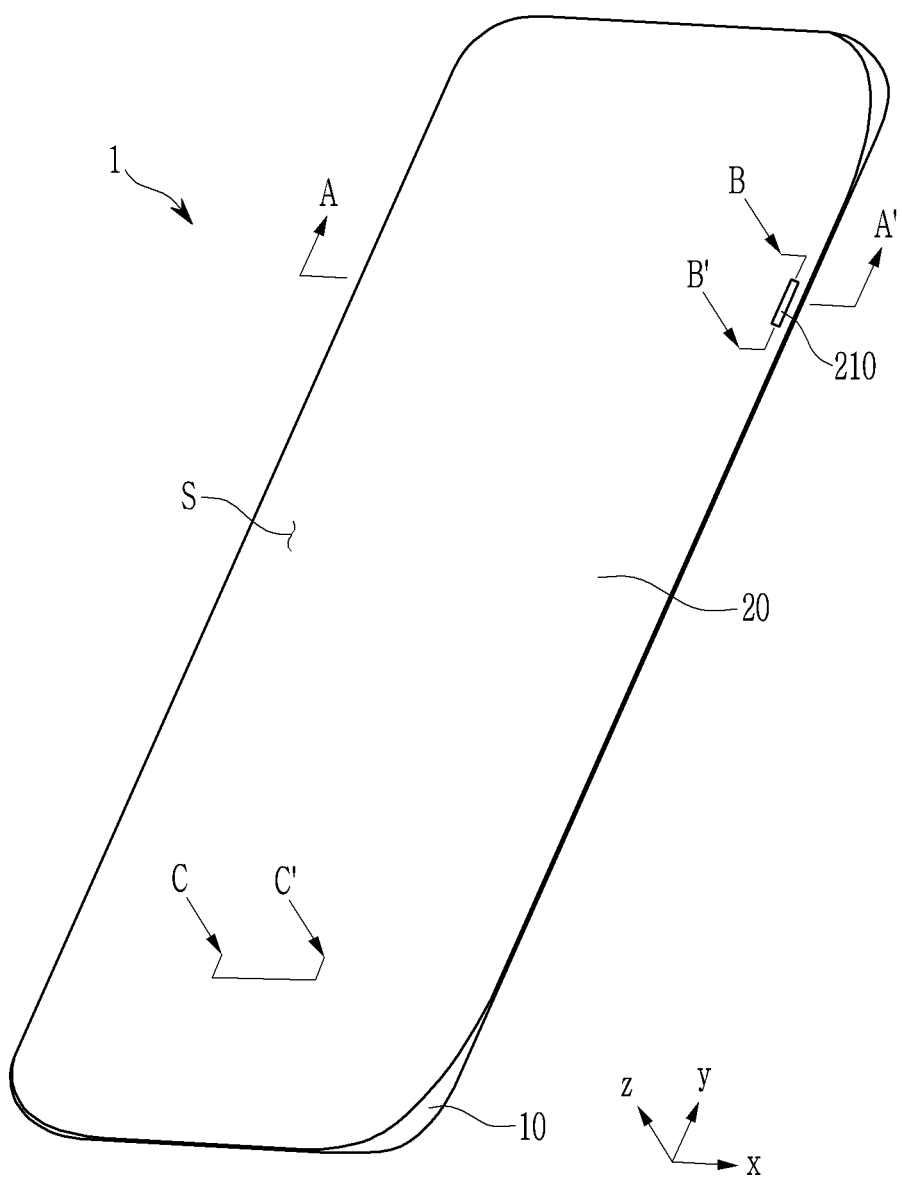
FIG. 1 illustrates a perspective view of an electronic device according to embodiments described herein.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements. To describe the inventive concept, parts that are irrelevant to the description are omitted, and like numerals refer to like or similar constituent elements throughout the specification.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Further, sizes and thicknesses of constituent members shown in the accompanying drawings are arbitrarily given for better understanding and ease of description, and may or may not be drawn to scale. When desired for clarity, relative thicknesses or dimensions may be described in relation to aspects of exemplary embodiments, or be described relative to other features. In the drawings, the thicknesses of layers, films, panels, regions, etc., may be exaggerated for clarity. In the drawings, for better understanding and ease of description, the thicknesses of some layers and areas may be exaggerated.

Figure 2:
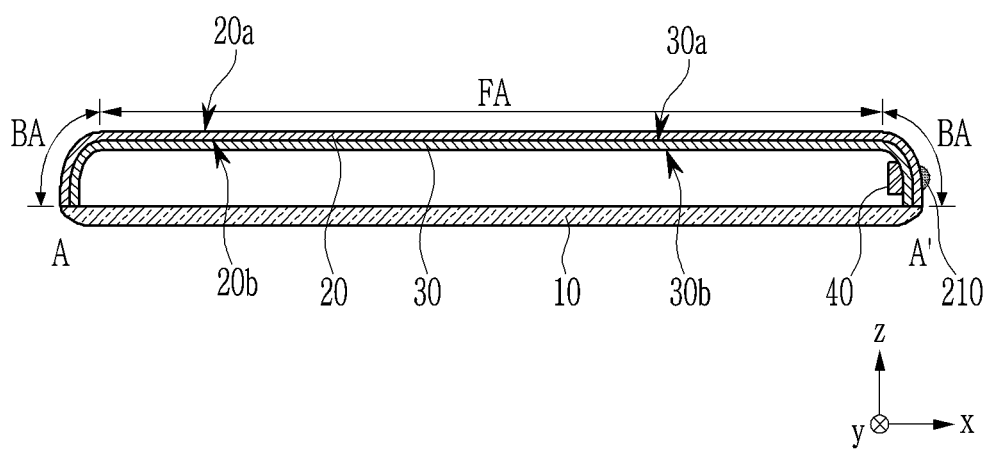
FIG. 2 illustrates a cross-sectional view taken along line A-A' of FIG. 1 according to embodiments described herein.

FIG. 1 illustrates a perspective view of an electronic device 1 according to embodiments described herein, and FIG. 2 illustrates a cross-sectional view taken along line A-A' of FIG. 1 according to embodiments described herein.

Referring to FIG. 1 and FIG. 2, the electronic device 1 may be a mobile device such as a smart phone, a mobile phone, a tablet, or a multimedia player having a screen S positioned at least in the front thereof. The electronic device 1 includes a set cover 10 and a window 20 that provide an outer surface of the electronic device 1. Various constituent elements of the electronic device 1 may be disposed in an internal space defined by the set cover 10 and the window 20. For example, the constituent elements of the electronic device 1 such as a display panel 30, a sensory button set 40, a driving circuit, a camera, a speaker, a microphone, a receiver, a communication module, a sensor, a processor, a memory, and a battery may be disposed inside the electronic device 1. In order to avoid complexity in the drawings, only the display panel 30 and the sensory button set 40 are illustrated in an internal space of the electronic device 1 in FIG. 2.

A front surface of the electronic device 1 may be mostly occupied by the screen S on which an image is displayed. Since an image displayed by the display panel 30 is transmitted to the user through the window 20, the screen S may correspond to the surface of the window 20. The window 20 is a kind of cover that protects the constituent elements disposed in the electronic device 1 from external shocks, similarly to the display panel 30 and the like. The window 20 may be formed of a transparent and rigid material, such as glass or plastic. The surface of the window 20 may be coated with functional layers such as a contamination prevention layer, an anti-reflective layer, and a hard coating layer. The set cover 10 may be invisible or almost invisible when the electronic device 1 is viewed from the front.

The window 20 has a front surface 20a and a rear surface 20b. The front surface 20a may be the outer surface that is exposed to external environmental elements and user contact. The rear surface 20b faces the cover 10.

The display panel 30 is disposed on the rear surface 20b of the window 20. The display panel 30 may be attached to the window 20. At least a portion of the display panel 30 may be flexible. The display panel 30 serves to display an image or video in the electronic device 1, and may have a structure in which pixels are arranged on a substrate. The pixels may be formed of, e.g., a light emitting diode such as an organic light emitting diode, and the display panel 30 may be a light emitting display panel in which circuit elements and light emitting diodes are formed on a substrate. The display panel 30 may include an anti-reflective layer on a surface facing the window 20 and a protective film on an opposite surface thereto. The protective film may include functional layers such as a passivation layer, an impact absorption layer (cushion layer), a heat dissipation layer, and a shielding layer.

The display panel 30 has a front surface 30a and a rear surface 30b. The front surface 30a may be an outer surface that contacts the rear surface 20b of the window 20. The rear surface 30b of the display panel 30 faces the cover 10. The display panel 30 may receive elements thereon, therein, and there-through.

The display panel 30 includes a display area corresponding to the screen S on which an image is displayed. The pixels are arranged in the display area, and images or videos are displayed by a combination of pixels. The display panel 30 may include a non-display area surrounding the display area. Circuits and/or wires configured to generate and/or transfer various signals applied to the display area may be disposed in the non-display area. A pad unit in which pads configured to receive signals from the outside of the display panel 30 or outputting signals to the outside of the display panel 30 are arranged may be disposed in the non-display area.

One or more of four corner edge regions of the window 20 and the display panel 30 are bent. The window 20 may serve as a supporter configured to maintain a bending state of the display panel 30. In the illustrated embodiment, all of the four edge regions of the window 20 and the display panel 30 are bent. The window 20 and the display panel 30 include a flat area FA and a bending area BA. The entire flat area FA and most of the bending area BA may correspond to the screen of the electronic device 1 and the display area of the display panel 30.

The bending area BA may substantially be a side surface in the electronic device 1. Accordingly, in a typical electronic device, it is difficult to provide a physical button that may be disposed on a side surface of the electronic device (e.g., a side surface of the set cover 10 or a set frame that is coupled to the set cover 10) on the side surface of the electronic device 1. The physical button is a button provided for a user to manipulate the electronic device 1, and a power on/off function, a wake-up/sleep function, a volume up/down function, a vibration on/off function, a scroll function, etc. may be performed by pressing the physical button.

The electronic device 1 according to an embodiment may include a button 210 on the front surface 20a of the window 20 having the same or similar functions as physical buttons. The button 210 may protrude from the front surface 20a of the window 20. The button 210 may be bonded to the front surface 20a of the window 20, or may be formed when the window 20 is manufactured. The button 210 may be engraved in the window 20, or may include an engraved portion and a protruded portion. The user may tactilely and/or visually check the position of the button 210 for the manipulation of the electronic device 1, and may perform a pressing operation like a normal physical button. Unlike conventional physical buttons, when the button 210 is pressed, a region of the window 20 where the button 210 is disposed may be pressed rather than the button 210 itself. Accordingly, the button 210 may be viewed as a kind of indicator indicating a position to be pressed. The button 210 also may not be physically provided on the front surface 20a of the window 20, but may be displayed as an image by the display panel 30 to be visually recognized by the user.

The electronic device 1 includes the sensory button set 40 that reacts to the pressing operation of the button 210. The sensory button set 40 may be disposed in the electronic device 1 to correspond to the button 210. The sensory button set 40 may be disposed in close contact with a rear surface of the display panel 30.

The sensory button set 40 will be described in detail with reference to FIG. 3.

Figure 3:
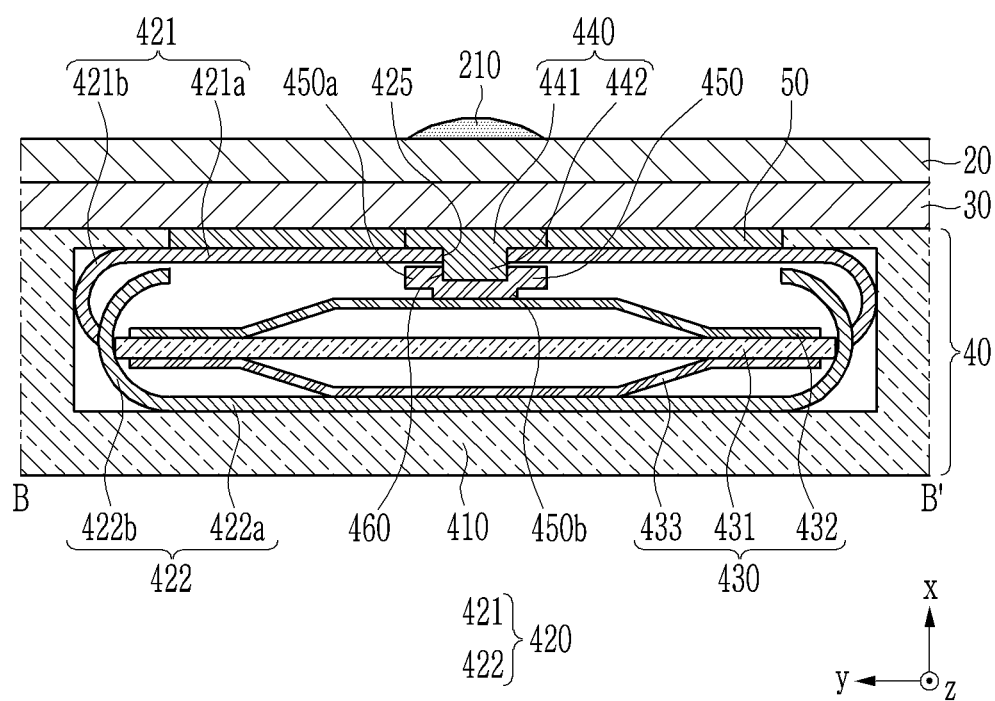
FIG. 3 illustrates a cross-sectional view taken along line B-B' of FIG. 1 according to embodiments described herein.
Figure 4:
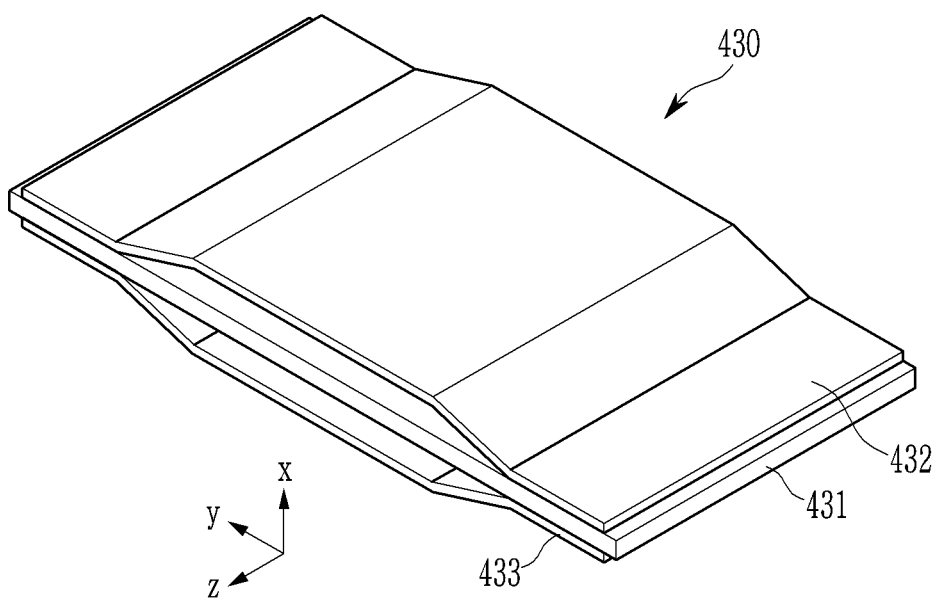
FIG. 4 illustrates a perspective view of a sensor unit according to embodiments described herein.

FIG. 3 illustrates a cross-sectional view taken along line B-B' of FIG. 1 according to embodiments described herein, and FIG. 4 illustrates a perspective view of a sensor unit 430 according to embodiments described herein.

Referring to FIG. 3, the electronic device 1 includes the sensory button set 40 positioned inside a periphery of the display panel 30 and cover 10. The sensory button set 40 includes a frame 410, a fixing member 420, the sensor unit 430, a pusher 440, and a push pad 450. The sensory button set 40 may be attached to the display panel 30 by an adhesive member 50. The adhesive member 50 may have a form of a film. A first surface of opposite surfaces of the adhesive member 50 may contact the display panel 30, and a second surface may contact the fixing member 420.

The frame 410 may define an overall appearance, configuration, and position of the sensory button set 40. The frame 410 may accommodate the fixing member 420, and the fixing member 420 may be disposed so as to not be separated from the frame 410. The frame 410 may be made of a plastic or a metal.

The fixing member 420 accommodates the sensor unit 430, and serves to support a position and space of the sensor unit 430 in the frame 410. The fixing member 420 may be made of a material having at least a portion that may be deformed due to pressure and that may be restored when the pressure is released. For example, the fixing member 420 may be formed of a metal plate. The fixing member 420 includes a plurality of portions, e.g., a first fixing member 421 and a second fixing member 422. The first fixing member 421 and the second fixing member 422 respectively include flat portions 421a and 422a and bending portions 421b and 422b at opposite sides thereof. The bending portions 421b and 422b may be curved. Such a structure of the first and second fixing members 421 and 422 may be formed by bending opposite edge portions of the metal plate. In the illustrated embodiment, the bending portions 421b and 422b may have a substantially semicircular cross-sectional structure, but shapes of the bending portions 421b and 422b may be variously changed.

The flat portions 421a and 422a of the first and second fixing members 421 and 422 may be in close contact with an inner surface of the frame 410. A width of the first fixing member 421 may be wider than that of the second fixing member 422 in a second direction y, and the first fixing member 421 may cover the second fixing member 422 in the x direction. The bending portions 421b of the first fixing member 421 may be mounted on opposite sides of the second fixing member 422. The first fixing member 421 may be disposed such that the bending portion 421b surrounds the bending portion 422b, and an edge of the bending portion 421b may contact an outer surface of the bending portion 422b. Accordingly, the fixing member 420 may be disposed to maintain its position within the frame 410. In addition, when the button 210 is pressed, the bending portion 421b of the first fixing member 421 may bend and the flat portion 421a of the first fixing member 421 towards the middle thereof may shift toward the sensor unit 430, and thus the pressing force may be effectively transferred to the sensor unit 430. In addition, when the button 210 is released, the first fixing member 421 may be restored to its original shape and position.

The sensor unit 430 is provided to sense the pressing of the button 210. For example, the sensor unit 430 generates an electrical signal in response to the pressing, that is, an external force applied to a predetermined region (a region where the button 210 is positioned) of the window 20 by a user. The generated signal may be processed by a processor or the like so that the electronic device 1 may be operated, for example, may be turned on or off, corresponding to the pressing of the button 210. In order to sense a press, the sensor unit 430 includes a pressure sensor 431 including a piezoelectric material, such as lead zirconate titanate (PZT) or a quantum tunneling composite (QCT). The pressure sensor 431 may include a piezoelectric material layer and a pair of electrodes disposed at opposite sides thereof. Pressing and releasing of the sensor 431 by the first and second support plates 432 and 433 may generate measurable and detectable electronic signals within the piezoelectric material.

Referring to FIG. 3 and FIG. 4, the sensor unit 430 may include a first support plate 432 and a second support plate 433 disposed at opposite sides of the pressure sensor 431. The first and second support plates 432 and 433 may support the pressure sensor 431 disposed there between, and may transfer a force (pressure) generated by pressing the button 210 to the pressure sensor 431. Each of the first and second support plates 432 and 433 may have a structure in which opposite edge portions thereof are in close contact with the pressure sensor 431, and a center portion thereof is separated from the pressure sensor 431. The first and second support plates 432 and 433 may function as vibration plates that vibrate upon expansion and contraction of the pressure sensor 431. The pressure sensor 431 may extend wider than the first and second support plates 432 and 433 in the y direction, making contact with the bending portions 422b of the second fixing member 422, and providing additional support to components of the sensory button set 40. Components of the sensory button set 40 are spaced close together in order to increase a sensitivity of the sensor unit 430 to users pressing an area including the button 210 through the window 20 and display panel 30.

The pressure sensor 431 may also function as a vibrating element that is operated by an inverse piezoelectric effect. For example, when a user presses the button 210, the pressure sensor 431 generates an electrical signal caused by a potential difference generation, the processor (not illustrated) performs an operation corresponding to the generated electrical signal, and applies a voltage to the pressure sensor 431. Thus the pressure sensor 431 may be deformed, that is, expanded and contracted. When the pressure sensor 431 expands and contracts, the first and second support plates 432 and 433 coupled to the pressure sensor 431 vibrate, and such vibration may be transferred to the user through the display panel 30, the window 20, and the button 210. Accordingly, the pressure sensor 431 may sense the pressing of the button 210 and generate a vibration corresponding to the pressing of the button 210 to provide tactile feedback (also referred to as haptic feedback) to the user. Although not the same as the tactile sense when a physical button is pressed, the tactile feedback allows the user to recognize that the button 210 has been pressed. Pressing of the button 210 may trigger other actions to alert a user, such as sound or flashing light in the button area or on the display screen S.

Although the pressure sensor 431 may serve not only as a pressure sensing element but also as a vibration element, the pressure sensor 431 may function only as the pressure sensing element and may include a separate vibration element.

The pusher 440 serves to press the sensor unit 430 by force applied to the button 210. Because the window 20 is made of a rigid material with no hole through it in the button area, it may be difficult to transfer a force applied to the button 210 positioned on the surface of window 20 to the sensor unit 430. That is, the pressure transferred to the sensor unit 430 is weak compared to the force applied to the button 210, so without structures described in accordance with embodiments described herein, it may be difficult to sense the pressing of the button 210. The pusher 440 may include a receiving portion 441 having a relatively large area and width, and a concentrating portion 442 having a relatively narrow area and smaller width in the y direction than the receiving portion 441 in order to increase sensitivity of the press of the user. A depth of the concentrating portion 442 in the x direction may be larger than a depth of the receiving portion 441. The receiving portion 441 may receive the force applied to the button 210 in a relatively large area, and the concentrating portion 442 may concentrate the force received by the receiving portion 441. The receiving portion 441 may be in close contact with the display panel 30, and the concentrating portion 442 may protrude from the receiving portion 441 toward the sensor unit 430. The receiving portion 441 may be positioned between the display panel 30 and the fixing member 420, and the concentrating portion 442 may be inserted into the fixing member 420 through an opening 425 of the fixing member 420. The concentrating portion 442 may make contact with the push pad 450 within an indentation 460 of the push pad 450. The indentation 460 may be configured to receive the push pad 450.

The T-shaped push pad 450 may include a flat area 450a and an extension area 450b. In an x direction, the flat area 450a may have a depth larger than a depth of the extension area 450b.

The push pad 450 is disposed between the pusher 440 and the sensor unit 430. The push pad 450 serves to mitigate an impact such that the sensor unit 430 is not damaged by a force concentrated by the pusher 440. The push pad 450 may be a cushioning material having elasticity, such as a silicon pad. A first surface of opposite surfaces of the push pad 450 may contact the pusher 440 (particularly the concentrating portion 442), and a second surface may contact the sensor unit 430 (particularly the first support plate 432).

In the illustrated embodiment, the push pad 450 is entirely disposed inside the fixing member 420, but the push pad 450 may be partially disposed outside the fixing member 420 as well.

The electronic device 1 according to exemplary embodiments will now be described based on the sensory button set 40 with reference to FIG. 5 to FIG. 11.

FIG. 5, FIG. 6, FIG. 7, FIG. 8, FIG. 9, FIG. 10, and FIG. 11 respectively illustrate cross-sectional views taken along line A-A' of FIG. 1 according to embodiments described herein.

Figure 5:
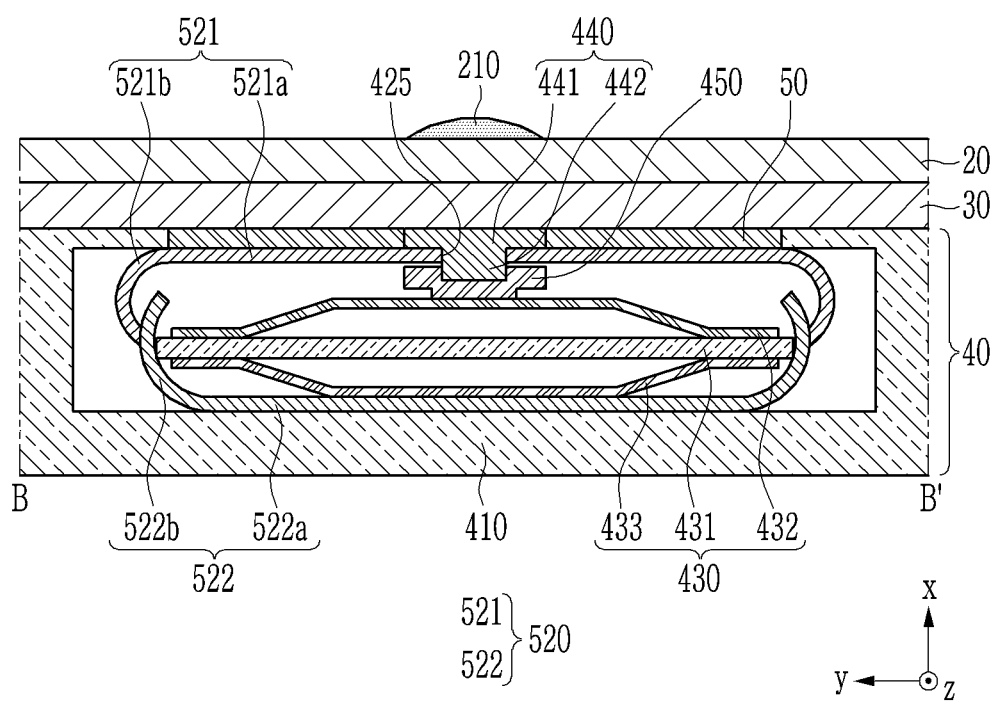
FIG. 5 illustrates a cross-sectional view of an exemplary embodiment taken along line A-A' in accordance with embodiments described herein.
Figure 6:
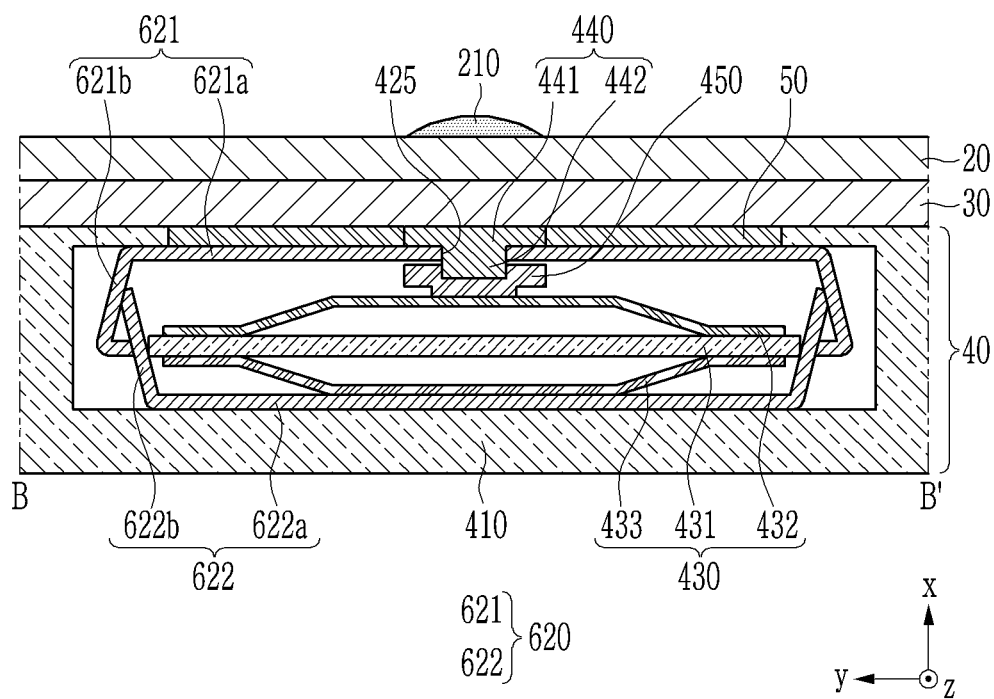
FIG. 6 illustrates a cross-sectional view of another exemplary embodiment taken along line A-A' in accordance with embodiments described herein.
Figure 7:
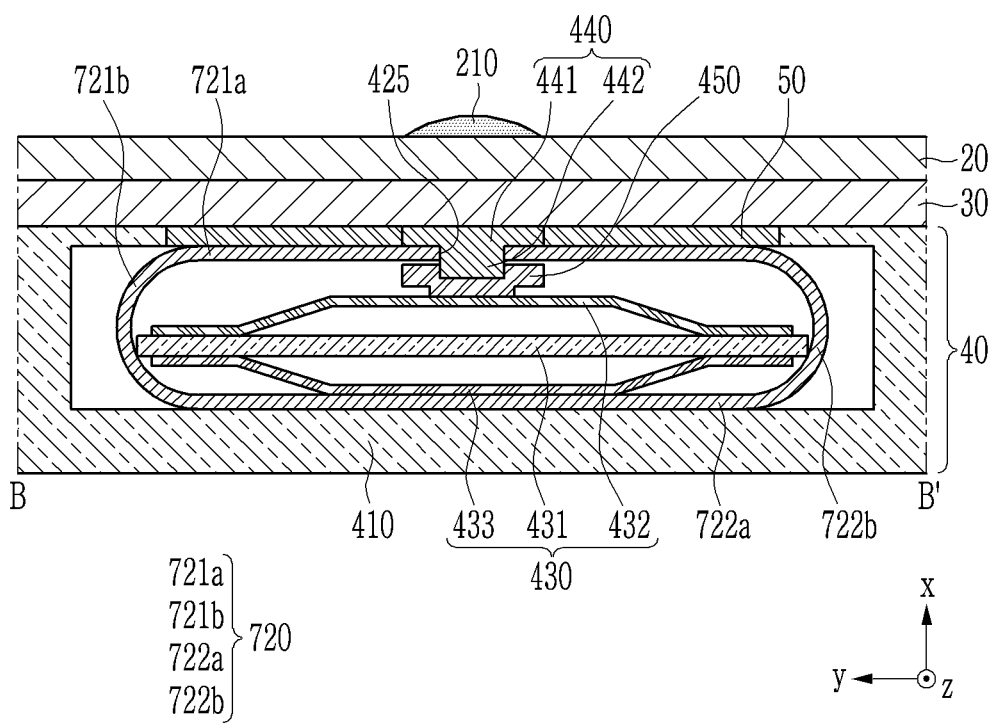
FIG. 7 illustrates a cross-sectional view of another exemplary embodiment taken along line A-A' in accordance with embodiments described herein.

FIG. 5, FIG. 6, and FIG. 7 illustrate embodiments in which the fixing member 420 is modified to improve the reliability of the sensory button set 40. A size, shape, opening, etc. of the fixing member 420 may be variously modified according to the strength of the window 20 and/or the shape of the sensor unit 430.

Referring to FIG. 5, a fixing member 520 may include a first fixing member 521 and a second fixing member 522, and the first and second fixing members 521 and 522 respectively include flat portions 521a and 522b and bending portions 521b and 522b on opposite sides thereof. Unlike in the embodiment of FIG. 3 in which opposite ends of the bending portion 421b touch or almost touch the frame 410, in the embodiment of FIG. 5, opposite ends of the bending portion 521b are separated from the frame 410. According to the present embodiment, when the button 210 is pressed, a margin in which the bending portion 521b of the first fixing member 521 may be spread outward in the y direction may increase. Therefore, force generated by pressing the button 210 may be more effectively transferred to the sensor unit 430, which may be advantageous when the strength of the window 20 is high.

Referring to FIG. 6, a fixing member 620 includes the first fixing member 621 and the second fixing member 622, and the first and second fixing member 621 and 622 include the flat portions 621a and 622a and the bending portions 621b and 622b at opposite sides thereof, respectively. The bending portions 621b and 622b include flat portions, but the flat portions extend in different directions from the flat portions 621a and 622a. The first fixing member 421 may have a trapezoidal shape with flat portion 621a being positioned inside flat edge portions 621c. The bending portions 622b may extend away from the flat portion 622a at an angle α greater than 90 degrees. The bending portion 621b may have a structure surrounding the bending portion 622b in the y direction in order to improve a binding force between the first and second fixing members 621 and 622. Flat edge portions 621c of the bending portion 621b may contact an outer surface of the bending portion 622b. An edge of the bending portion 622b may contact an inner surface of the bending portion 621b.

Referring to FIG. 7, a fixing member 720 includes two flat portions 721a and 722b and two bending portions 721b and 722*b* at opposite sides thereof, and the flat portions 721*a* and 722*b* and the bending portions 721*b* and 722*b* are integrally formed, and form a continuous structure that interrupted only by the pusher 440 at the opening 425. That is, the fixing member 720 is formed as a single component. The bending portions 721*b* and 722*b* may have a substantially semicircular cross-sectional shape, but may be variously modified.

In FIG. 8, FIG. 9, FIG. 10, and FIG. 11, exemplary embodiments in which a contact area with the sensor unit 430 is modified by modifying the size and/or shape of the pusher 440 and/or the push pad 450 are illustrated in order to optimize sensing performance of the sensor unit 430. The contact area with the sensor unit 430 may be variously modified depending on the specification of the sensor unit 430.

Figure 8:
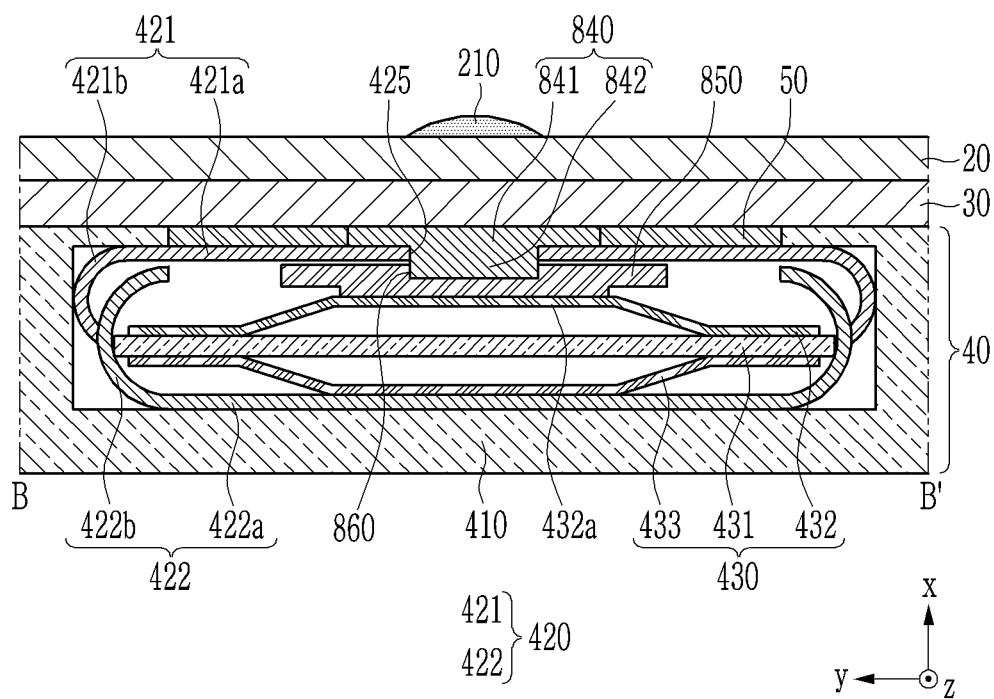
FIG. 8 illustrates a cross-sectional view of another exemplary embodiment taken along line A-A' in accordance with embodiments described herein.
Figure 9:
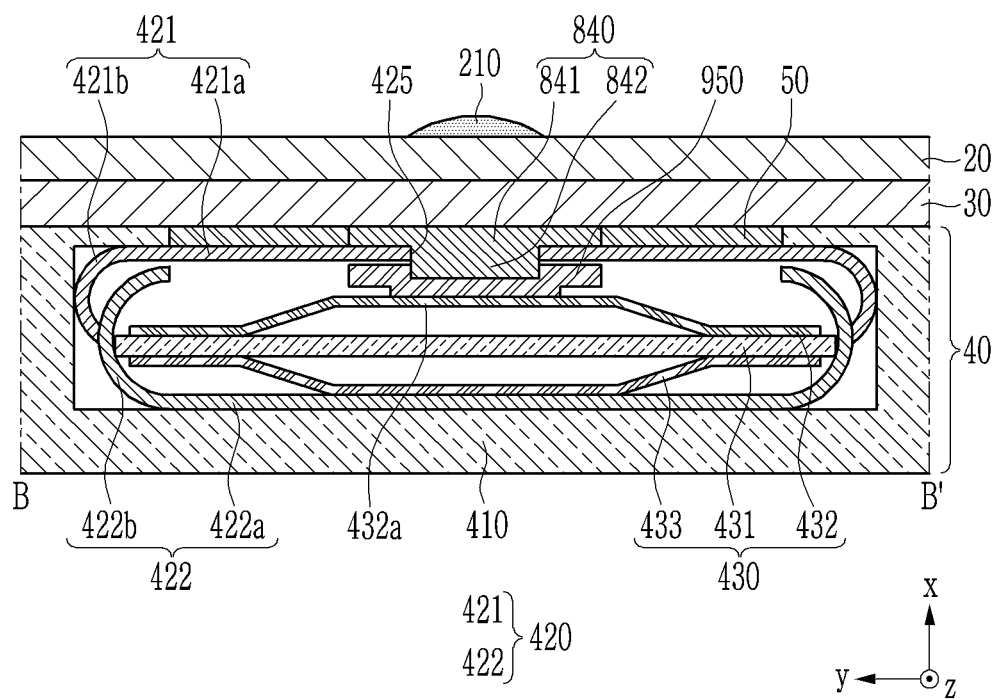
FIG. 9 illustrates a cross-sectional view of another exemplary embodiment taken along line A-A' in accordance with embodiments described herein.

Referring to FIG. 8 and FIG. 9, in the two embodiments, the push pads 850 and 950 are similar in shape to a substantially T-shaped cross-section. The contact areas with the sensor unit 430 vary in width. In FIGS. 8 and 9 a larger pusher 840 may be used to spread out force applied on the button 210 to the respective push pads 850 and 950.

In FIG. 8, a contact area between the push pad 850 and first support plate 432 may take up substantially an entire surface of an upper portion 432*a* of the first support plate 432. A width of the T-shaped push pad 850 may extend beyond a width of the upper portion 432*a* in the y direction.

A receiving portion 841 of the pusher 840 may have a width substantially the same as the upper portion 432*a* of the first support plate 432 in the y direction. A width of the receiving portion 841 may be smaller than a width of the contact area between the push pad 850 and the first support plate 432. A concentrating portion 842 of the pusher 840 may make contact with the push pad 850 in an indentation 860 of the push pad 850. A size of the pusher 840 may be relatively the same in FIGS. 8-11 as different push pads are configured respectively therewith.

In FIG. 9, a contact area between the push pad 950 and first support plate 432 may take up less than an entire surface of the upper portion 432*a* of the first support plate 432. A width of the T-shaped push pad 950 may extend substantially a same width as the upper portion 432*a* of the first support plate 432 in the y direction.

Figure 10:
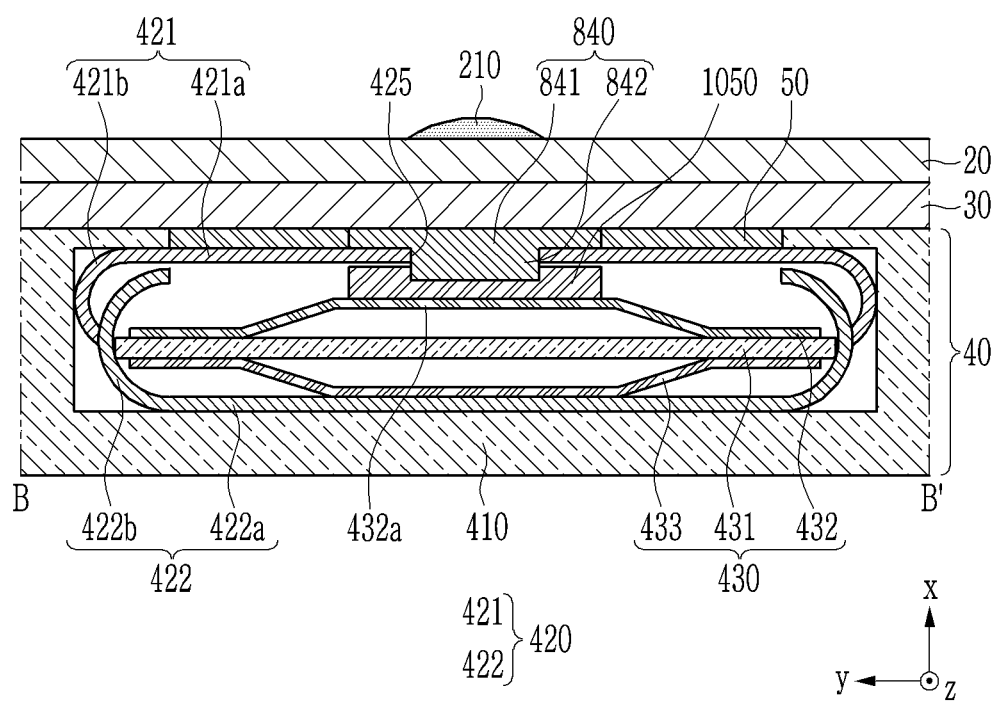
FIG. 10 illustrates a cross-sectional view of another exemplary embodiment taken along line A-A' in accordance with embodiments described herein.
Figure 11:
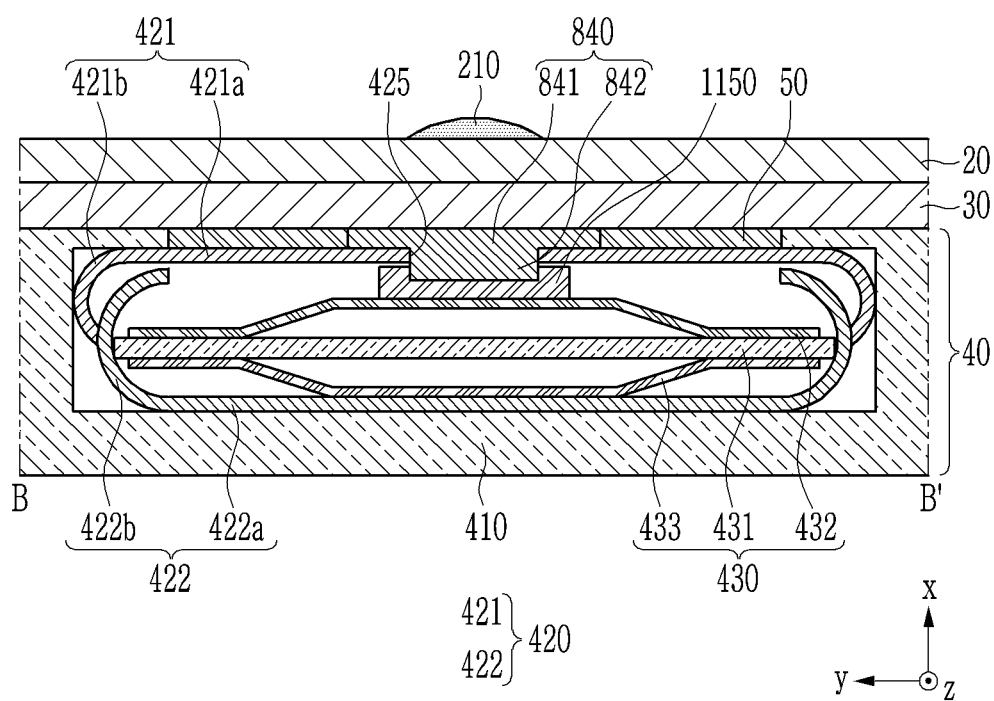
FIG. 11 illustrates a cross-sectional view of another exemplary embodiment taken along line A-A' in accordance with embodiments described herein.

Referring to the two embodiments shown in FIG. 10 and FIG. 11, push pads 1050 and 1150 may have a substantially straight cross-section, but the contact areas with the sensor unit 430 vary in width.

In FIG. 10, a contact area between the push pad 1050 and first support plate 432 may take substantially an entire surface of the upper portion 432*a* of the first support plate 432. A width of the straight cross section push pad 1050 may extend substantially a same width as the upper portion 432*a* of the first support plate 432 in the y direction.

In FIG. 11, a contact area between the push pad 1150 and first support plate 432 may take up less than an entire surface of the upper portion 432*a* of the first support plate 432. A width of the straight cross section push pad 1150 may extend less than a width of the upper portion 432*a* of the first support plate 432 in the y direction.

Figure 12:
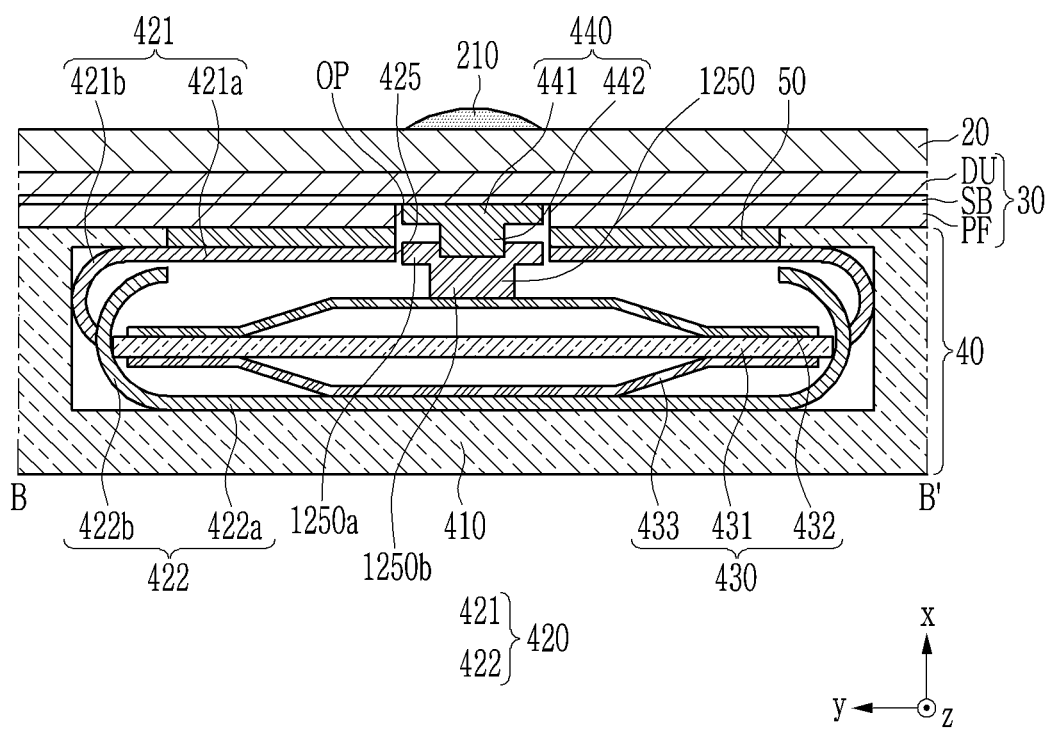
FIG. 12 illustrates a cross-sectional view of another exemplary embodiment taken along line A-A' in accordance with embodiments described herein.

FIG. 12 illustrates a cross-sectional view taken along line A-A' of FIG. 1 according to an embodiment described herein.

Referring to FIG. 12, an embodiment in which the pusher 440 is embedded in the display panel 30 is illustrated. The display panel 30 is representative of display panels illustrated in other embodiments. Here different layers are exploded to illustrate additional features of exemplary embodiments. The display panel 30 includes a substrate SB, a display unit DU including a transistor, a light emitting diode, and the like formed on the substrate SB, and a protection film PF attached under the substrate SB. The protective film PF includes an opening OP, and the pusher 440 of the sensory button set 40 is disposed in the opening OP. The pusher 440 may be attached to the substrate SB. As such, the opening OP may be formed in the protection film PF of the display panel 30, and a constituent element such as the pusher 440 of the sensory button set 40 may be disposed in the opening OP, thereby transferring the force generated by pressing to the sensor unit 430 without being buffered or lost by the protection film PF. Further, some constituent elements of the sensory button set 40 may be embedded in the display panel 30 to reduce the assembly cost. In addition to the pusher 440, a push pad 1250 may also be at least partially disposed within the opening OP and have a larger extension area 1250*b* than a flat area 1250*a* in the x direction.

Figure 13:
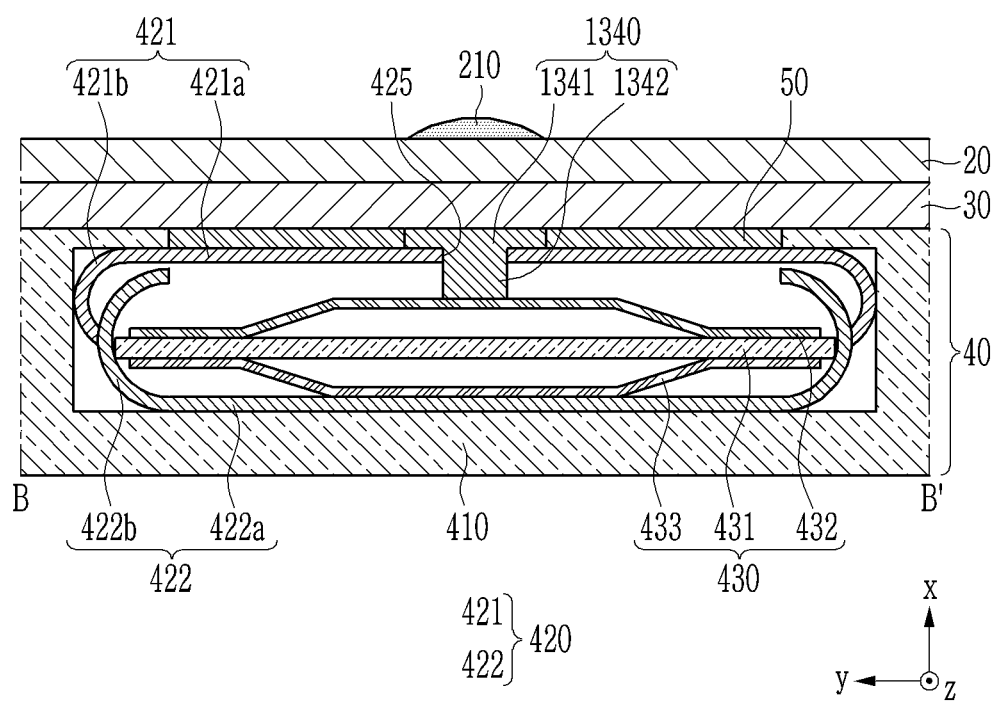
FIG. 13 illustrates a cross-sectional view of another exemplary embodiment taken along line A-A' in accordance with embodiments described herein.
Figure 14:
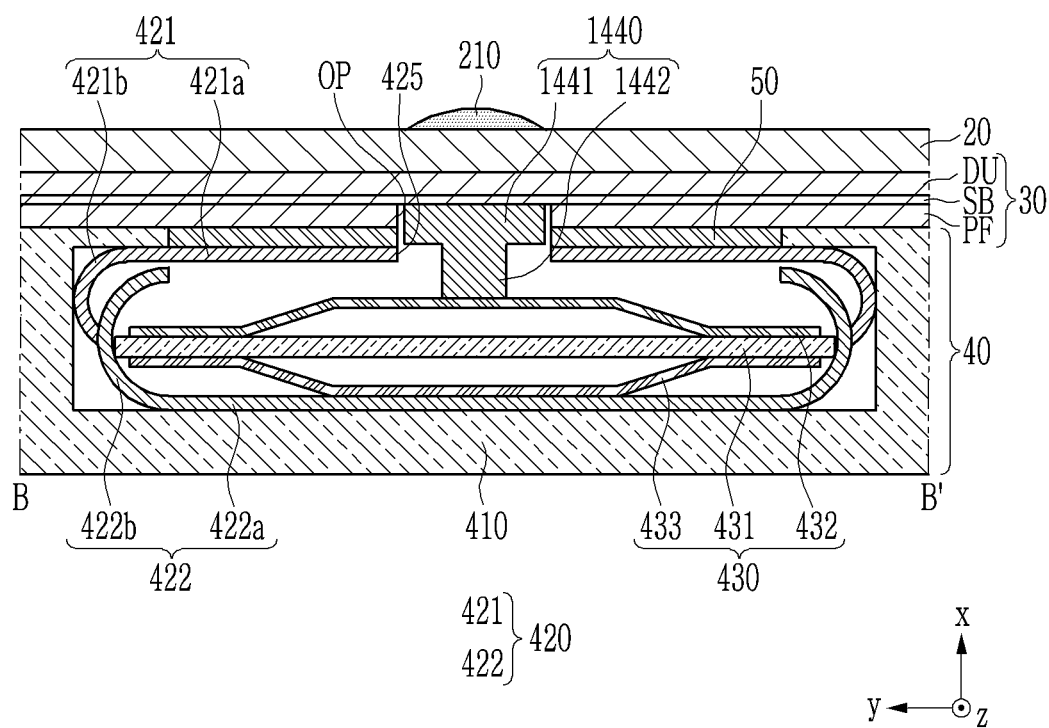
FIG. 14 illustrates a cross-sectional view of another exemplary embodiment taken along line A-A' in accordance with embodiments described herein.

FIG. 13 and FIG. 14 each illustrate a cross-sectional view taken along line A-A' of FIG. 1 according to embodiments described herein.

FIG. 13 and FIG. 14 illustrate embodiments in which the sensory button set 40 does not include the push pad 450 described above. Because the sensory button set 40 does not include the push pad 450, a pusher 1340 of varying shape may be formed and disposed to be in contact with the sensor unit 430. For example, the concentrating portion 1342 of the pusher 1340 connected to the receiving portion 1341 may extend through the first fixing member 421 and directly press the first support plate 432 of the sensor unit 430 in response to the pressing of the button 210 by a user. Because the force of the pressing of the user may be directly transferred to the sensor unit 430 through the pusher 1340 without passing through the push pad 450, the sensitivity of the sensor unit 430 may be increased.

In FIG. 14, a receiving portion 1441 of a pusher 1440 may be disposed coplanar in the y direction with both the adhesive layer 50 and the protection film PF. The concentrating portion 1442 of the pusher 440 may extend through the first fixing member 421 and directly press the first support plate 432 of the sensor unit 430 in response to the pressing of the button 210 by a user.

The embodiments in which the sensory button set 40 is disposed inside the side surface of the electronic device 1 corresponding to the bending area BA of the window 20 and the display panel 30 are described herein. Alternatively, the sensory button set 40 may be disposed inside the front of the electronic device 1 corresponding to the flat area FA of the window 20 and the display panel 30. For example, FIG. 3 and FIG. 5 to FIG. 14 and aspects of other embodiments described herein may respectively correspond to cross-sections taken along line C-C' in FIG. 1. Because the surface of the window 20 may preferably be smooth in the flat area FA, the button 210 configured to guide a position corresponding to the sensory button set 40 may be visually provided as an image displayed at the display panel 30 instead of being provided on the surface of the window 20.

A cross-sectional structure of the display panel 30 will be described in detail with reference to FIG. 15.

Figure 15:
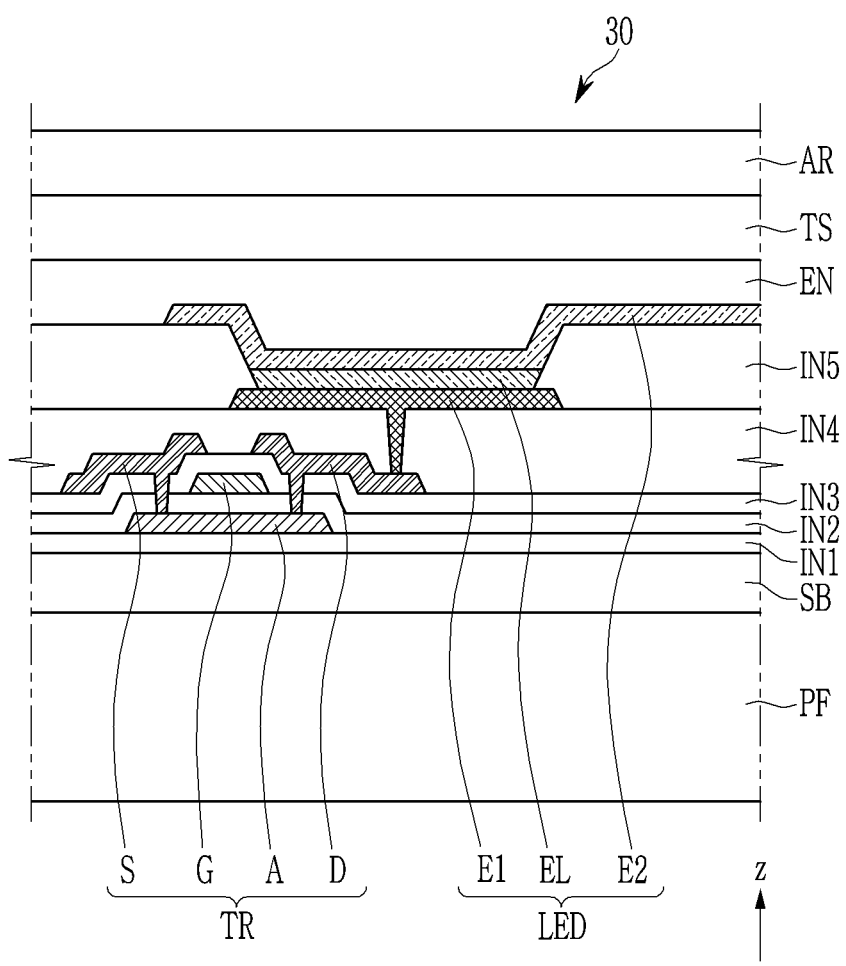
FIG. 15 illustrates a cross-sectional view of a display panel according to embodiments described herein.

FIG. 15 illustrates a cross-sectional view of the display panel 30 according to an embodiment. The cross-section illustrated in FIG. 15 may substantially correspond to one pixel area.

Referring to FIG. 15, the display panel 30 may basically include a substrate SB, a transistor TR formed on the substrate SB, and a light emitting diode LED connected to the transistor TR.

The substrate SB may be a flexible substrate made of a polymer such as polyimide (PI), polyamide (PA), or polyethylene terephthalate (PET). The substrate SB may include a barrier layer configured to prevent moisture, oxygen, etc. from penetrating from the outside. For example, the substrate SB may include one or more polymer layers and one or more barrier layers, and the polymer layers and the barrier layers may be alternately stacked.

A first insulating layer IN1 may be disposed on the substrate SB. The first insulating layer IN1 may be referred to as a buffer layer, and may serve to block impurities that may diffuse from the substrate SB to a semiconductor layer A and reduce stress applied to the substrate SB in a process of forming the semiconductor layer A Semiconductor A may refer to an active region. The barrier layer and the first insulating layer IN1 may include an inorganic insulating material such as a silicon oxide, a silicon nitride, or the like.

The semiconductor layer A of the transistor TR may be disposed on the first insulating layer IN1, and a second insulating layer IN2 may be disposed on the semiconductor layer A. The semiconductor layer A may include a source region and a drain region, and a channel region between these regions. The semiconductor layer A may include a semiconductor material such as polysilicon, an oxide semiconductor, and amorphous silicon. The second insulating layer IN2 may be referred to as a gate insulating layer, and may include an inorganic insulating material.

A gate conductor including a gate electrode G of the transistor TR may be disposed on the second insulating layer IN2. The gate conductor may include a metal such as molybdenum (Mo), copper (Cu), aluminum (Al), silver (Ag), chromium (Cr), tantalum (Ta), or titanium (Ti).

A third insulating layer IN3 may be disposed on the gate conductor. The third insulating layer IN3 may be referred to as a gate insulating layer, and may include an inorganic insulating material.

A data conductor including a source electrode S and a drain electrode D of the transistor TR may be disposed on the third insulating layer IN3. The source electrode S and the drain electrode D may be connected to the source region and the drain region of the semiconductor layer A through openings of the third insulating layer IN3 and the second insulating layer IN2, respectively. The data conductor may be made of a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni).

A fourth insulating layer IN4 may be disposed on the data conductor. The fourth insulating layer IN4 may be referred to as a planarization layer, and may include an organic insulating material. A passivation layer, which is an inorganic insulating layer, may be disposed between the data conductor and the fourth insulating layer IN4.

A first electrode E1 may be disposed on the fourth insulating layer IN4. The first electrode E1 may be referred to as a pixel electrode. The first electrode E1 may be connected to the drain electrode D through an opening of the fourth insulating layer IN4.

A fifth insulating layer IN5 may be disposed on the fourth insulating layer IN4. The fifth insulating layer IN5 may be referred to as a pixel definition layer, and may have an opening overlapping the first electrode E1. In the opening of the fifth insulating layer IN5, an emission layer EL may be disposed on the first electrode E1, and a second electrode E2 may be disposed on the emission layer EL. The second electrode E2 may be referred to as a common electrode (CE).

The first electrode E1, the light emitting layer EL, and the second electrode E2 may together constitute a light emitting diode LED, which may be an organic light emitting diode. The first electrode E1 may be an anode of a light emitting diode LED, and the second electrode E2 may be a cathode of a light emitting diode LED.

An encapsulation layer EN may be disposed on the second electrode E2. The encapsulation layer EN may encapsulate a light emitting diode LED to prevent moisture or oxygen from penetrating from the outside. The encapsulation layer EN may include at least one inorganic material layer and at least one organic material layer, and inorganic material layers and organic material layers may be alternately stacked. A capping layer and/or a functional layer may be disposed between the second electrode E2 and the encapsulation layer.

A touch sensor layer TS may be disposed on the encapsulation layer EN. The touch sensor layer TS may include touch electrodes made of a transparent conductive material such as ITO or IZO, a metal mesh, or the like, and the touch electrodes may be formed as a single layer or a multilayer. The touch sensor layer TS may be formed on the encapsulation layer EN, or may be separately formed and attached to the encapsulation layer EN.

An anti-reflective layer AR configured to reduce external light reflection may be disposed on the touch sensor layer TS. The anti-reflective layer AR may include a polarizer. An anti-reflection effect may be obtained by forming the sealing layer EN or the touch sensor layer TS in a refractive index matching structure without forming the anti-reflection layer AR separately.

Under the substrate SB, a protection film PF may be disposed to protect the display panel 30. The protection film PF may be referred to as a protecting sheet, a lower sheet, or the like, and may include a plurality of functional layers and/or films. For example, the protection film PF may include a passivation layer, an impact absorbing layer, a heat dissipation layer, and/or a shielding layer. The aforementioned sensory button set 40 may be attached to the display panel 30, particularly to the protection film PF in accordance with embodiments described herein.

Some of the advantages that may be achieved by exemplary implementations/embodiments of the invention and/or exemplary methods of the invention include different types buttons that may be placed in various areas of display devices.

While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:
1. An electronic device comprising:
a window having a front surface and a rear surface;
a display panel disposed on the rear surface of the window, the display panel having a front surface and a rear surface; and
a sensory button set disposed on the rear surface of the display panel,
wherein the sensory button set includes:
a sensor unit; and
a pusher disposed between the sensor unit and the display panel configured to transfer an external force applied to a predetermined area of the window to the sensor unit, wherein the pusher includes a receiving portion contacting the display panel and a concentrating portion protruding from the receiving portion toward the sensor unit.

2. The electronic device of claim 1, wherein:
the display panel includes a substrate and a protection film disposed at a rear surface of the substrate to have an opening; and
at least a portion of the pusher is positioned within the opening.

3. The electronic device of claim 1, wherein the sensor unit includes a pressure sensor and a support plate disposed at at least one side of the pressure sensor.

4. The electronic device of claim 3, wherein the support plate has opposite edge portions in contact with the pressure sensor and a central portion thereof separated from the pressure sensor.

5. The electronic device of claim 1, further comprising a button disposed on a surface of the window to correspond to the sensory button set.

6. The electronic device of claim 5, wherein the window and the display panel include a bending area, and the button is disposed in the bending area.

7. An electronic device, comprising:
a window having a front surface and a rear surface;
a display panel disposed on the rear surface of the window, the display panel having a front surface and a rear surface; and
a sensory button set disposed on the rear surface of the display panel,
wherein the sensory button set includes:
a sensor unit; and
a pusher disposed between the sensor unit and the display panel configured to transfer an external force applied to a predetermined area of the window to the sensor unit,
wherein:
the sensory button set further includes a frame and a fixing member disposed in the frame; and
the sensor unit is disposed within the fixing member.

8. The electronic device of claim 7, wherein:
the fixing member has an opening; and
the pusher includes a portion passing through the opening.

9. The electronic device of claim 7, wherein:
the fixing member includes a first fixing member and a second fixing member; and
opposite ends of the second fixing member surround the first fixing member.

10. The electronic device of claim 7, wherein:
the sensory button set further includes a push pad disposed between the pusher and the sensor unit; and
a first surface of opposite surfaces of the push pad contacts the pusher, while a second surface contacts the sensor unit.

11. The electronic device of claim 7, wherein the push pad is disposed within the fixing member.

12. The electronic device of claim 7, wherein:
the fixing member has an opening; and
the pusher contacts the sensor unit through the opening.

13. The electronic device of claim 7, further comprising an adhesive member disposed between the display panel and the sensory button set,
wherein a first surface of opposite surfaces of the adhesive member contacts the display panel, and a second surface contacts the fixing member.

14. An electronic device comprising:
a window having a front surface and a rear surface;
a display panel disposed on the rear surface of the window, the display panel having a front surface and a rear surface;
a sensor unit disposed on the rear surface of the display panel;
a pusher disposed between the display panel and the sensor unit; and
a fixing member to accommodate the sensor unit,
wherein the fixing member has an opening through which a portion of the pusher extends.

15. The electronic device of claim 14, wherein the pusher includes a first portion and a second portion having a narrower width than the first portion, and the first portion is in contact with the display panel.

16. The electronic device of claim 15, wherein:
the display panel includes a flat area and a bending area that is bent from the flat area; and
the pusher contacts the bending area of the display panel.

17. The electronic device of claim 14, further comprising a push pad disposed between the pusher and the sensor unit,
wherein the push pad includes a first surface that is in contact with the pusher and a second surface that is in contact with the sensor unit.

18. The electronic device of claim 17, wherein:
the sensor unit comprises a first support plate, a pressure senor, and a second support plate; and
the first support plate is in contact with the push pad.

19. The electronic device of claim 14, wherein:
the display panel includes a substrate and a protection film attached to the substrate; and
the pusher contacts the substrate through an opening of the protection film.

* * * * *